(12) United States Patent
Kawabata

(10) Patent No.: US 7,164,196 B2
(45) Date of Patent: Jan. 16, 2007

(54) SEMICONDUCTOR DEVICE

(75) Inventor: Takeshi Kawabata, Hirakata (JP)

(73) Assignee: Matsushita Electric Industrial Co., Ltd. (JP)

( * ) Notice: Subject to any disclaimer, the term of this patent is extended or adjusted under 35 U.S.C. 154(b) by 3 days.

(21) Appl. No.: 10/861,487

(22) Filed: Jun. 7, 2004

(65) Prior Publication Data

US 2004/0253825 A1 Dec. 16, 2004

(30) Foreign Application Priority Data

Jun. 11, 2003 (JP) ............................. 2003-165819

(51) Int. Cl.
*H01L 23/04* (2006.01)
*H01L 23/495* (2006.01)
*H01L 23/06* (2006.01)
*H01L 23/48* (2006.01)
*H01L 23/52* (2006.01)

(52) U.S. Cl. .................. 257/698; 257/666; 257/684; 257/690; 257/692; 257/731; 257/733; 257/748; 257/773; 257/781; 257/784

(58) Field of Classification Search ............. 257/731, 257/733, 666, 684, 690, 692, 698, 748, 773, 257/781, 784
See application file for complete search history.

(56) References Cited

U.S. PATENT DOCUMENTS

| | | | | |
|---|---|---|---|---|
| 5,451,815 A | * | 9/1995 | Taniguchi et al. | ........... 257/696 |
| 5,467,252 A | * | 11/1995 | Nomi et al. | ................ 361/760 |
| 5,744,827 A | * | 4/1998 | Jeong et al. | ................ 257/686 |
| RE36,773 E | * | 7/2000 | Nomi et al. | ................ 361/760 |
| 6,608,375 B1 | * | 8/2003 | Terui et al. | ................. 257/691 |
| 6,800,944 B1 | * | 10/2004 | Buschbom | ................... 257/778 |
| 2002/0017730 A1 | * | 2/2002 | Tahara et al. | ............... 257/786 |
| 2002/0149086 A1 | * | 10/2002 | Aoki | .......................... 257/528 |
| 2003/0111738 A1 | * | 6/2003 | Buschbom | ................... 257/778 |
| 2004/0092136 A1 | * | 5/2004 | Farnworth et al. | ............ 439/55 |

FOREIGN PATENT DOCUMENTS

| | | |
|---|---|---|
| JP | 6-112354 | 4/1994 |
| JP | 06-204357 | 7/1994 |
| JP | 06-334065 | 12/1994 |
| JP | 09-199627 | 7/1997 |

* cited by examiner

*Primary Examiner*—Ida M. Soward
(74) *Attorney, Agent, or Firm*—Steptoe & Johnson LLP

(57) ABSTRACT

A semiconductor device includes a base, a semiconductor element having a plurality of electrodes, a plurality of conductive lines connected to the electrodes of the semiconductor element, plating stubs attached to the conductive lines, and a plurality of wiring layers formed in a plurality of layers on the base. The plating stub attached to a first conductive line, and the plating stubs attached to one or a plurality of second conductive lines adjacent to the first conductive line, exist in different conductive wiring layers.

9 Claims, 14 Drawing Sheets

SEMICONDUCTOR DEVICE

FIELD OF THE INVENTION

This invention relates to a semiconductor device, and in particular to a semiconductor device with excellent noise resistance during signal transmission, yet which exhibits excellent advantages in the transmission of signals at high speeds.

BACKGROUND OF THE INVENTION

With the smaller sizes and faster operation of electronic equipment in recent years, there have begun to emerge demands for more highly integrated, sophisticated, and faster-running semiconductor devices as well. As a mode for mounting such semiconductor devices, grid array devices, in which leads are arranged across the entire surface of the device in an array shape rather than along the edges, have attracted attention as the mainstream of high-density mounting techniques, and are being further developed. In a grid array-type semiconductor device, ordinarily a wiring board is used to accommodate the demand. This is because by using a wiring board, wiring layers can be stacked in three dimensions so that numerous wires can be provided at high densities; in addition, there is great freedom in wiring layouts, and electrical reinforcement is also facilitated.

One example of a well-known BGA (ball grid array) type semiconductor device is disclosed in Japanese Patent Laid-open No. 6-112354.

In a well-known semiconductor device, as shown in FIG. 17, the semiconductor element 1 is mounted on the joined wiring board 50, and wiring bonding and the metal protrusions of bumps are used to electrically connect the terminals 2 on the semiconductor element 1 with the pads on the conductive lines 5 of the board 50. The wiring board 50 comprises a plurality of wiring layers. Via-holes 6 are provided to enable linking and electrical connection in the perpendicular direction of conductive lines in different wiring layers. Thereafter, resin sealing is performed, and after mounting electrode terminals called solder balls, the joined wiring board 50 is cut into individual boards along the dotted lines 3 in the figure.

The cut portions are the individualized boards shown in FIG. 18A and FIG. 18B. In these figures, 51 and 52 are wiring layers. The pads 9 of the conductive lines 5 are plated in order to secure connectivity. Electrolytic plating is generally used as this plating, due to considerations of cost and processing speed. Hence as shown in FIG. 17, plating leads 8 for electrolytic plating are connected to the conductive lines 5 via the plating stubs 7, and the pads 9 of the electrode tips are plated. Due to the ease of patterning, these plating leads 8 are attached to the wiring of either the uppermost layer or of the lowermost layer. These wiring leads 8 are all connected to the conductive lines 5 in the state of the joined board 50 shown in FIG. 17, and all are electrically short-circuited. But when plating of the pads 9 is completed and the individual boards are cut away, the plating leads 8 are unnecessary for signal transmission, and when the individual conductive lines 5 are short-circuited, signal transmission becomes impossible. Consequently the plating leads 8 are similarly cut away at the time the joined boards 50 are cut along the dotted lines 3, so that the individual conductive lines 5 are electrically independent; but after cutting, plating stubs 7 remain attached to each of the conductive lines as shown in FIG. 18A and FIG. 18B.

In this well-known configuration, the following problems arise.

First, when transmitting signals to various conductive lines 5 of the board, the remaining plating stubs 7 are completely unnecessary for electrical purposes. Further, because electroless plating must be used in order to completely remove them, due to considerations of cost and manufacturing capacity, removal is not practical.

Further problems based on the fact that plating stubs 7 remain are described below.

As the first problem, if the plating stub 7 exists together on the uppermost layer and lowermost layer of the board as shown in FIG. 17 and FIG. 18A, noise may flow into the conductive line 5 connected to this plating stub 7 via the plating stub 7 from the neighboring conductive lines 10 and 11, or noise may enter due to interference between the plating stubs 12 and 13, connected to the conductive lines 10 and 11, and the plating stub 7. Particularly in semiconductor devices using BGA and other wiring boards, often high wiring densities are employed; and because semiconductor devices are moving toward advanced functionality and increasing numbers of input and output terminals, wiring densities will continue to rise, and in addition to these concerns, in future there will inevitably occur such problems as electrical breakdown caused by electrical short-circuits between stubs and by migration. Where signal speeds are concerned also, frequencies may rise and signal amplitudes may decrease, and to this extent devices will be more sensitive to noise, so that the problems are anticipated to become more prominent.

A second problem is the length of the plating stub 7 itself. It is known that in general electromagnetic radiation is released from plating stubs, and this radiation noise causes problems in other signals, such as deformation of waveforms and signal delays. As the speeds of transmitted signals are increased, a plating stub 7 may come to have a capacitance, depending on the frequency and the signal type, with the possibility of adverse effects on signals transmitted over conductive lines; moreover, in impedance matching of a wiring board, unwanted reflections may occur due to the stubs, so that the targeted impedance may not be obtained. Also, unnecessary radiation noise entails energy losses.

No countermeasures whatsoever have been taken to alleviate the concerns with plating stubs in semiconductor devices of the prior art.

SUMMARY OF THE INVENTION

The present invention resolves the problems in well-known semiconductor devices described above, and has as an object the provision of a semiconductor device in which, primarily through innovations in design without incurring additional costs, distortion of signal waveforms due to noise from plating stubs and to radiation noise emitted from plating stubs themselves is prevented, and in which the inflow of noise from the outside via plating stubs is prevented, so that as a result signal transmission properties are excellent.

In order to achieve this object, a semiconductor device of this invention has the following configuration.

A semiconductor device of this invention comprises a semiconductor element having a plurality of electrodes, a plurality of conductive lines connected to the electrodes of the semiconductor element, plating stubs attached to the conductive lines, and a plurality of wiring layers formed on a base; and a plating stub attached to a first conductive line exists in a conductive wiring layer different from that of the plating stubs attached to one or a plurality of second conductive lines adjacent to the first conductive line.

By this means, the conductive lines transmitting signals and the plating stubs can be kept at a distance from the plating stubs of adjacent conductive lines, so that inflow of noise from plating stubs can be prevented.

It is preferable that the first conductive line be connected to ground or a power supply.

By this means, adverse effects from the plating stub of the first conductive line connected to ground or the power supply can be prevented.

In this invention, it is preferable that signals transmitted by the first conductive line be digital signals.

By this means, the noise can be effectively prevented.

In this invention, it is preferable that the frequency band of the digital signals be 100 MHz or above.

By this means, the noise can be effectively prevented.

In this invention, it is preferable that a distance between the plating stub attached to the first conductive line and the plating stubs attached to the second conductive lines be greater than the minimum line interval between the plating stub attached to the first conductive line and other plating stubs existing in the same wiring layer as the plating stub attached to the first conductive line.

By this means, in addition to the measures to counter noise, interference between plating stubs can be more efficiently prevented.

Another aspect of this invention comprises a semiconductor element having electrodes, conductive lines connected to the electrodes of the semiconductor element, plating stubs attached to the conductive lines, and a plurality of wiring layers formed on a base; the conductive lines are formed spanning a plurality of the wiring layers, and the plating stubs are formed from the conductive lines toward the periphery of the base; in addition, based on the layout of the conductive lines, a wiring layer is formed enabling the lengths of the wiring stubs to be minimized.

Still another aspect of this invention comprises a semiconductor element is provided in a base and having electrodes, conductive lines connected to the electrodes of the semiconductor element, plating stubs attached to the conductive lines, and a plurality of wiring layers formed on the base; the conductive lines are formed from the electrodes, spanning a plurality of the wiring layers toward the face opposite of the face in which the semiconductor element is provided in the base, and also from the electrodes toward the periphery of the base; and the plating stubs are formed in the wiring layer of the opposite face, from the conductive lines toward the periphery of the base.

Still another aspect of this invention comprises a semiconductor element provided in a base and having electrodes, conductive lines connected to the electrodes of the semiconductor element, plating stubs attached to the conductive lines, and a plurality of wiring layers formed on the base; the conductive lines are formed from the electrodes, spanning a plurality of the wiring layers toward the face opposite of the face in which the semiconductor element is provided in the base, and from the periphery of the base toward the center of the base; and the plating stubs are formed in the wiring layer of the face on the side of the semiconductor element, from the conductive lines toward the periphery of the base.

According to these configurations, the lengths of the plating stubs can be made as short as possible, so that electrical radiation and noise from plating stubs, and electrical interference between plating stubs, can be effectively prevented. Also, impedance matching in the wiring board is facilitated, and signal distortion can be reduced.

Still another aspect of this invention comprises a semiconductor element having a plurality of electrodes, a plurality of conductive lines connected to the electrodes of the semiconductor element, and wiring stubs attached to the conductive lines; and the line widths of the plating stubs are formed smaller than the line widths of the conductive lines.

In this case, it is preferable that the line width of a plating stub attached to a first conductive line and positioned adjacent to a second conductive line be formed smaller than the line width of the first and/or the second conductive line.

Still another aspect of this invention comprises a semiconductor element having a plurality of electrodes, a plurality of conductive lines connected to electrodes of the semiconductor element, and wiring stubs attached to the conductive lines; and the line intervals between the plating stubs attached to the conductive lines are formed larger than the line intervals between adjacent conductive lines.

In this case, it is preferable that the line interval between the plating stub attached to a first conductive line and adjacent to a second conductive line, and the second conductive line, be formed larger than the line interval between the first conductive line and the second conductive line.

By this means, the effects of electrical radiation and noise from wiring stubs, as well as electrical interference between wiring stubs, can be effectively prevented.

By means of the invention, a semiconductor device can be provided having excellent electrical properties, in which electromagnetic radiation and noise originating in wiring stubs can be prevented and electrical interference between wiring stubs can be reduced.

DESCRIPTION OF THE PREFERRED EMBODIMENTS (Embodiment 1)

Figure 1:
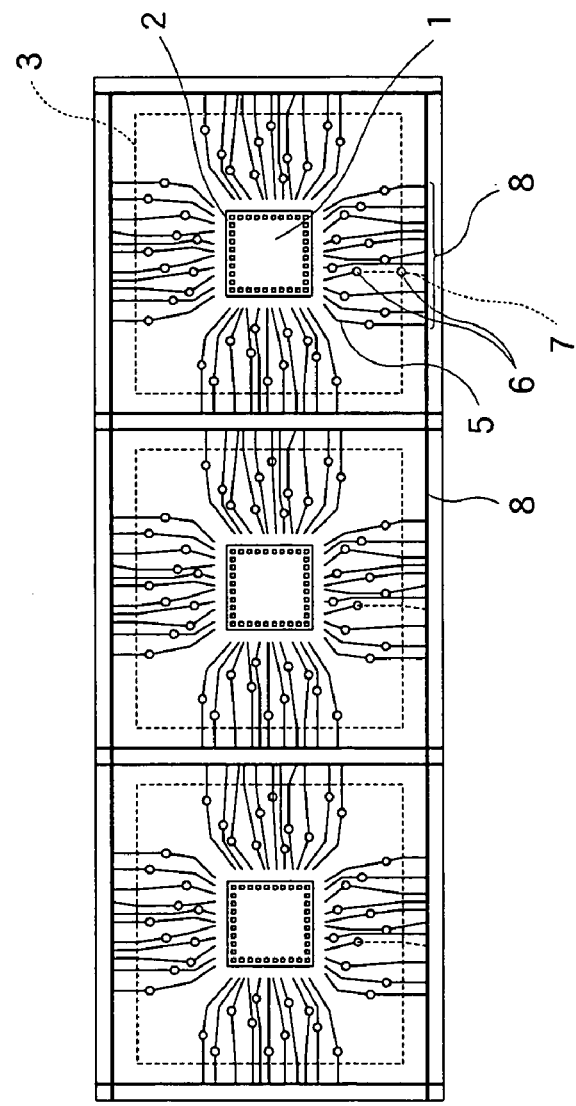
FIG. 1 is a plan view of a wiring board of embodiment 1 of a semiconductor device of this invention.
Figure 2A:
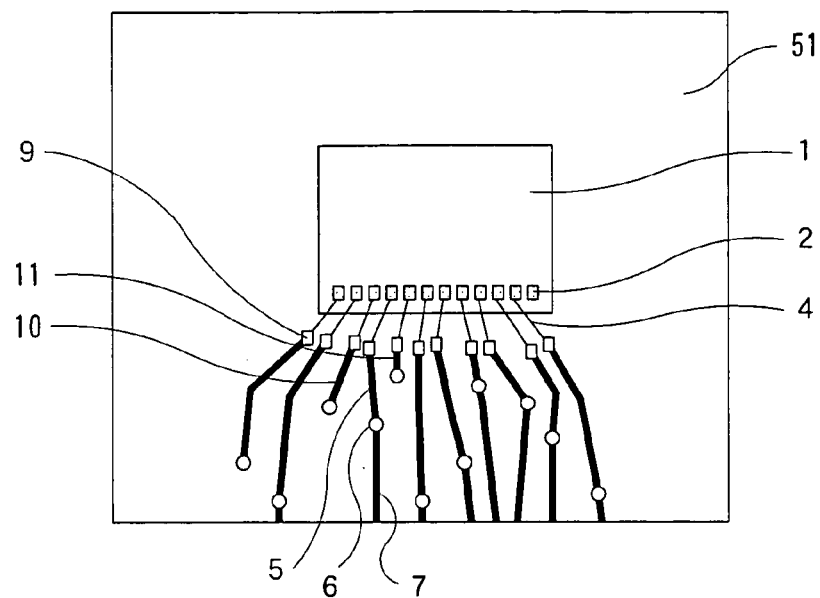
FIG. 2A and FIG. 2B show the wiring pattern of the wiring board of embodiment 1 of the semiconductor device of this invention.
Figure 2B:
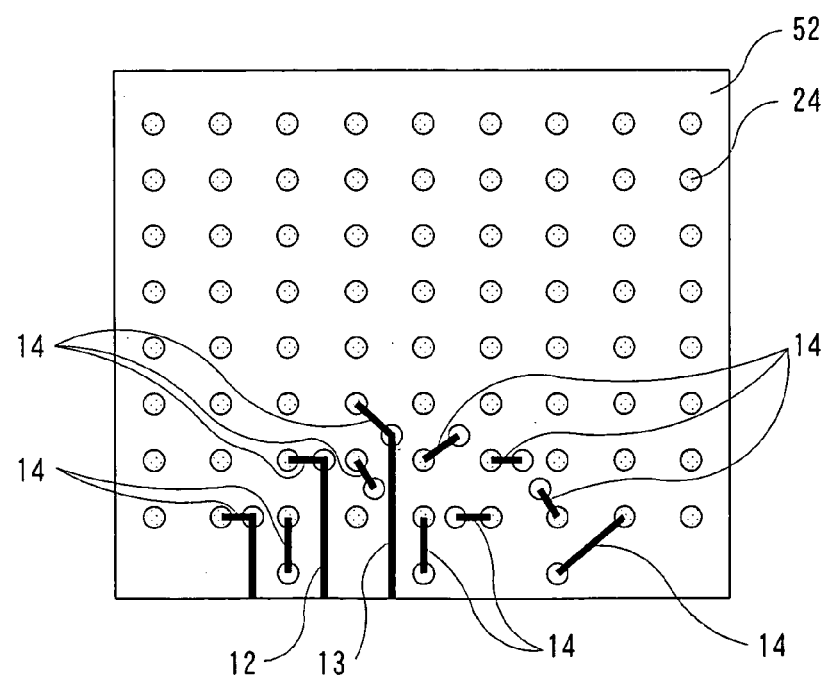

FIG. 1 is a plan view of a wiring board of embodiment 1 of the semiconductor device of this invention. FIG. 2A is an enlarged view of a portion of the semiconductor device of FIG. 1, showing an example of the pattern in the top layer of an individualized board of FIG. 1, and showing, among the four directions in FIG. 1 the pattern in only one representative direction. FIG. 2B is an example of the lower-layer pattern.

In FIG. 1, a semiconductor element 1 has electrode terminals 2. Here, the semiconductor element 1 is mounted on the wiring board, but is not yet sealed with resin. Similarly to the well-known case, after solder ball mounting following sealing, cutting is ultimately performed along the individual cutting positions 3 indicated by the dotted lines.

In FIG. 2A and FIG. 2B, 51 denotes a wiring layer which forms the top layer, and 52 denotes a wiring layer which forms the bottom layer. The wiring board is electrically connected to the semiconductor element 1 by wires 4, and on the wiring board there are conductive lines 5, via-holes 6 which connect the conductive lines in different wiring layers in the vertical direction, and plating stubs 7 connected to the conductive lines. Prior to board cutting, the plating stubs 7 are connected to plating wires 8 in FIG. 1, and so these can be used in electroplating. When electroplating is performed after using a solder resist or similar to mask portions other than pads 9 provided at the connection ends of the conductive lines 5 in FIG. 2, plating is performed only on the pads 9, and the interface for connection of wires 4 and conductive lines 5 can be protected. When the conductive lines 5 are of copper material, in general, gold electroplating is performed after nickel electroplating as the plating. Here, as one example of the structure of connection of the semiconductor element 1 with the wiring board, connection by wires 4 is shown; but there are no limitations in particular on the connection method or materials, and it is sufficient that electrical connection of the two be possible. Because the configuration and relations of each of the portions are similar in all the following embodiments, hereafter detailed explanations are omitted.

In this embodiment 1, plating stubs 12 and 13 of conductive lines 10 and 11 adjacent to the plating stub 7 of the conductive line 5 connected to an analog terminal of the semiconductor element 1 are not in the same wiring layer 51 as the plating stub 7, but are provided in the separate wiring layer 52. In this case, the plating stubs 12 and 13 may be provided in the layer immediately below, or two layers below, so long as the wiring layer is different. When the total number of layers in the wiring board is greater than one, the device is within the scope of this embodiment 1. 14 denotes conductive lines in the lower layer, and 24 denotes solder balls.

Figure 3A:
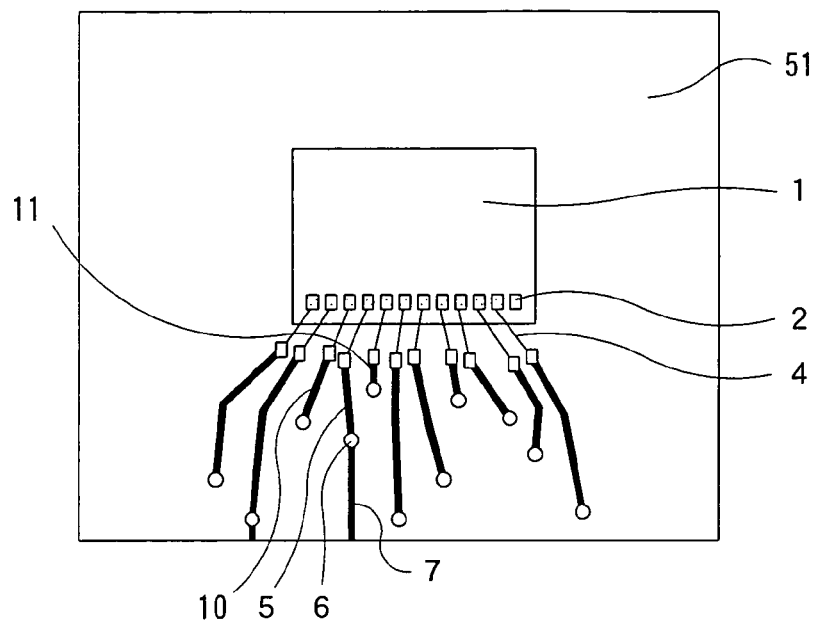
FIG. 3A and FIG. 3B show another wiring pattern of the wiring board of embodiment 1 of the semiconductor device of this invention.
Figure 3B:
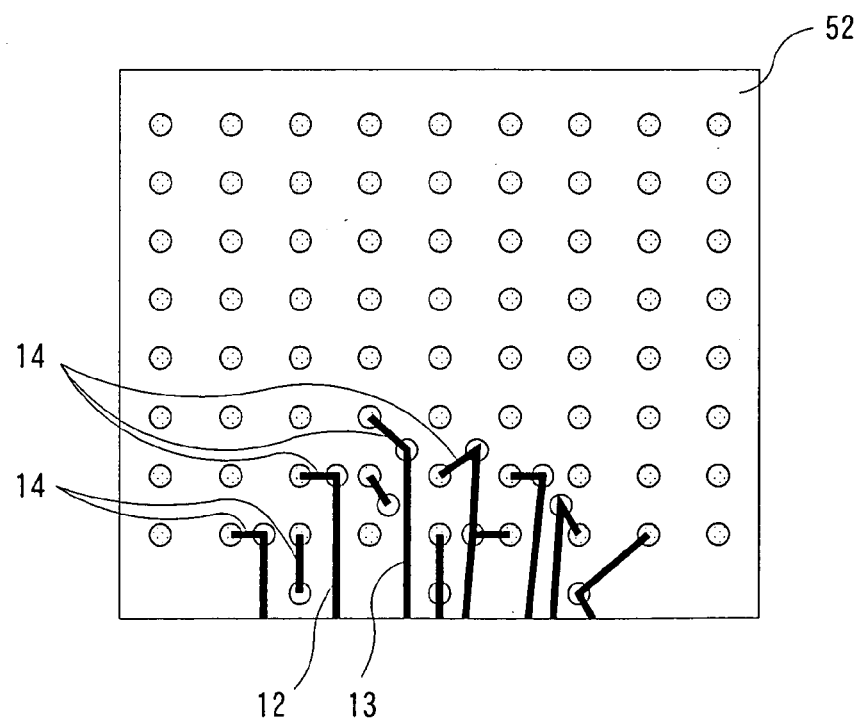

According to this embodiment 1, it is sufficient that at least the plating stubs 12, 7, 13 of the adjacent conductive lines 10, 5, 11 exist in separate layers; in an extreme case, as shown in FIG. 3A and FIG. 3B, the plating stubs of all the remaining conductive lines other than the conductive line 5 may be in different wiring layers. However, in any case formation of the plating stubs is performed all at once, similarly to normal patterning of the conductive lines in each of the layers, so that the number of processes is the same as when this embodiment is not adopted. That is, when providing plating stubs 12 and 13 for the conductive lines 10 and 11 on either side of the analog conductive line 5 in the lower layer, as in the case of embodiment 1, the plating stubs 12 and 13 are prepared in advance as a portion of the pattern of the lower layer 52 as shown in FIG. 2B, and patterned together with the conductive lines 14. When providing plating stubs 12, 13 in the wiring layer 52 other than the top layer in this way, these plating stubs 12, 13 are connected to the plating lead 8 through the via-hole 6 when the boards are in the joined condition as shown in FIG. 1.

Figure 4A:
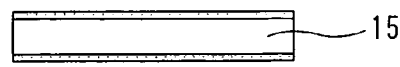
FIG. 4A to FIG. 4G show an example of a method of manufacture of the wiring board of embodiment 1 of this invention.
Figure 4B:
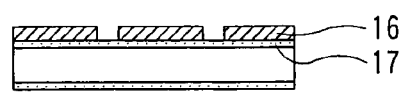
Figure 4C:
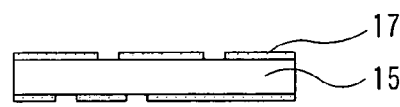
Figure 4D:
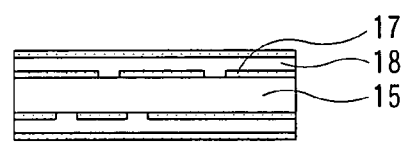
Figure 4E:
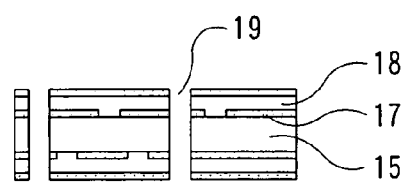
Figure 4F:
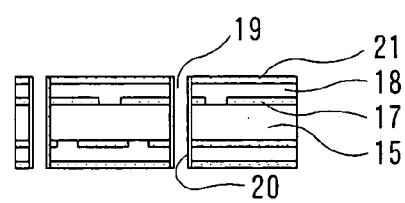
Figure 4G:
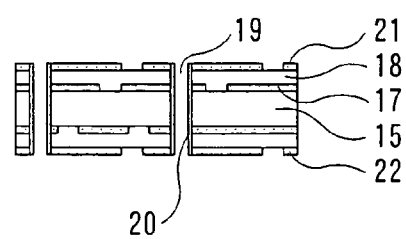

The manufacturing methods to realize the semiconductor device of this embodiment 1 are entirely within the scope of the prior art, the only difference being the layers on which the wiring stubs are provided. FIG. 4A to FIG. 4F show an example of a method of manufacture of the wiring board of this embodiment 1. More specifically, a insulating layer 15 with copper foil shown in FIG. 4A is patterned using photoresist 16 as shown in FIG. 4B, to remove unnecessary portions of the copper foil 17 in the interior layer as shown in FIG. 4C. When the two-sided patterning shown in FIG. 4C is completed, an insulating film 18 with copper foil for an outer layer is pressed onto the top as shown in FIG. 4D, and through-holes 19 are opened using a drill as shown in FIG. 4E; copper plating 20 of these portions is then performed as in FIG. 4F, for an electrical connection to an outer-layer copper foil 21 of the uppermost layer. The uppermost layer and lowermost layer may be patterned similarly to the interior layer, as shown in FIG. 4G. 22 denotes the outer layer copper foil of the lowermost layer.

The above is a manufacturing method for a representative four-layer board; however, this manufacturing method is only one example, and in this embodiment 1 it is sufficient that during patterning of each layer the plating stubs 12 and 13 be provided in the target layer. For example, even if the outer-layer copper foil 22 of the lowermost layer in FIG. 4G is patterned as shown in FIG. 2B, and the other layers are only patterned similarly to the above description, the device corresponds to this embodiment 1.

According to the above configuration, because the plating stub 7 of the conductive line 5 which transmits analog signals and at least the plating stubs 12 and 13 of the conductive lines 10 and 11 on either side thereof are in different wiring layers, the plating stub 7 and plating stubs 12 and 13 are not adjacent, the intervals between these plating stubs are large, and the distance between these plating stubs 12 and 13 and the conductive line 5 is also large. Consequently even if electromagnetic radiation and noise are generated from the plating stubs 12 and 13, adverse effects on the conductive line 5 transmitting analog signals can be prevented.

Hence a semiconductor device can be supplied in which noise is minimal and there is little distortion of the waveforms of transmitted analog signals.

(Embodiment 2)

Figure 5A:
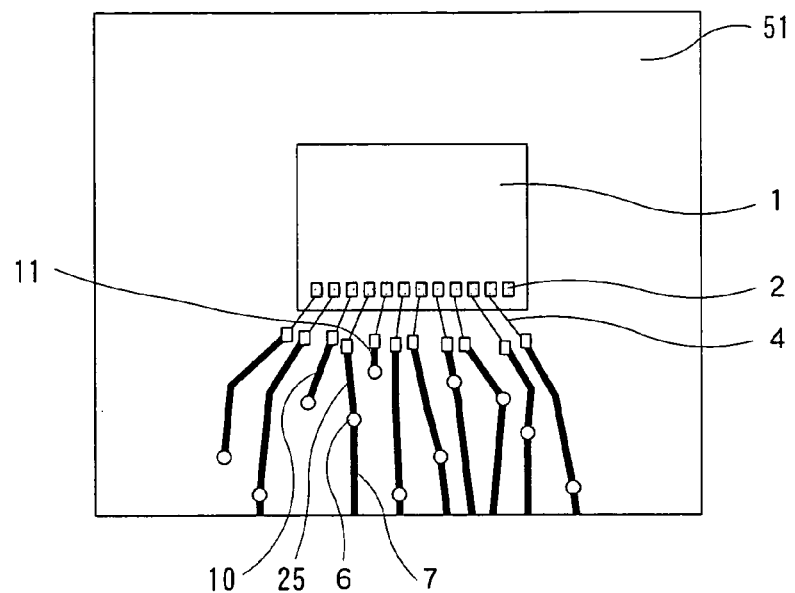
FIG. 5A and FIG. 5B show an example of a wiring pattern of embodiment 2 of the semiconductor device of this invention.
Figure 5B:
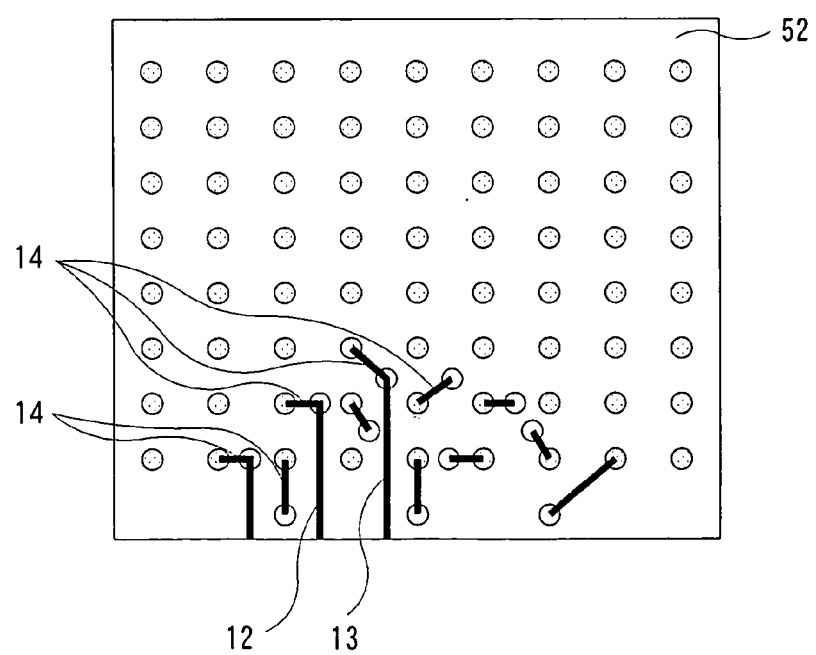

FIG. 5A and FIG. 5B show an example of a wiring pattern of a wiring board of embodiment 2 of the semiconductor device of this invention. Reference numerals in the figures are, except for a conductive line 25, the same as those used in FIG. 1, FIG. 2A, and FIG. 2B. This embodiment 2 differs from embodiment 1 in that the transmission signal of the relevant conductive line, that is, of the specific conductive line formed such that the wiring layer is different from the wiring layer of the adjacent conductive lines, is either ground or a power supply. That is, in FIG. 5A and FIG. 5B, the specific conductive line 25 is connected to ground or a power supply.

According to the above configuration, because the wiring layer 51 for the plating stub 7 of the conductive line 25 for ground or the power supply is different from at least the wiring layer 52 for the plating stubs 12, 13 of the adjacent conductive lines 10, 11, the plating stubs are not adjacent, the interval between plating stubs is large, and the distance of the plating stubs 12 and 13 from the conductive line 25 is also large. Consequently even if electromagnetic radiation and noise is caused from the plating stubs 12 and 13, adverse effects on the ground or power supply conductive line 25 can be prevented.

Hence a semiconductor device can be supplied with minimal noise in the ground or power supply.

(Embodiment 3)

Figure 6:
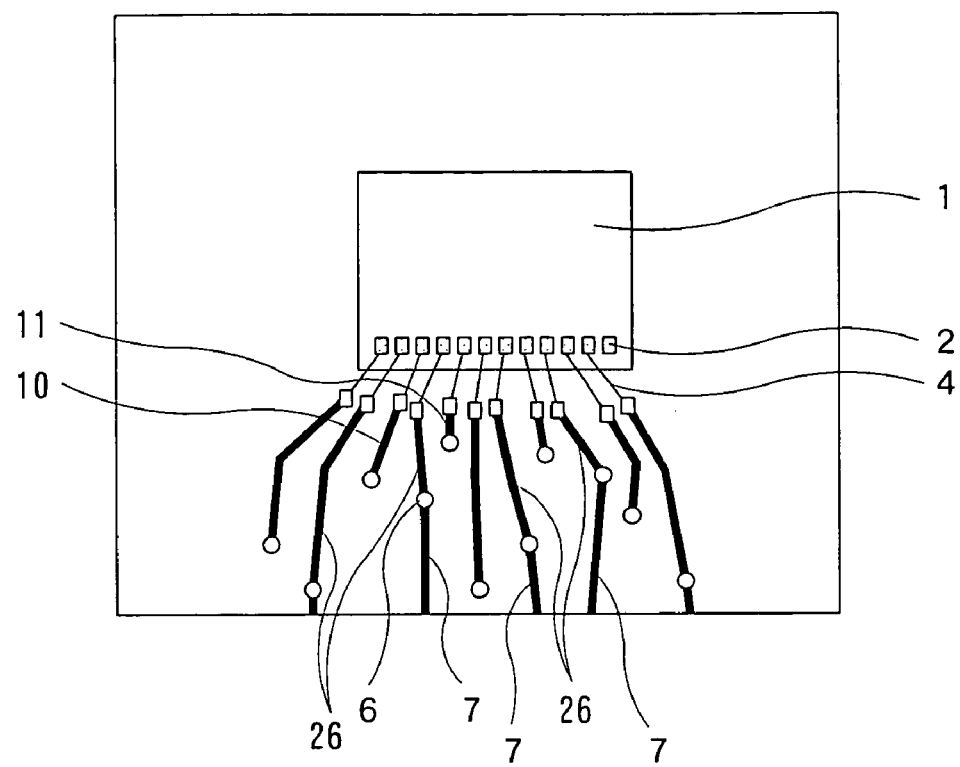
FIG. 6 shows an example of a wiring pattern of embodiment 3 of the semiconductor device of this invention.

FIG. 6 shows an example of a wiring pattern of embodiment 3 of a semiconductor device of this invention. Reference numerals in the figures are, except for the conductive line 26, the same as those used in FIG. 1, FIG. 2A, and FIG. 2B. This embodiment 3 differs from embodiment 1 in that the transmission signal of the relevant conductive line is a digital signal.

According to the above configuration, the wiring layer of the wiring stub 7 of the digital signal conductive line 26 is different from that of, at least, the plating stubs 12 and 13 (not shown) of the conductive lines 10 and 11 on either side; hence these are not adjacent and there is a large interval therebetween, and the distance from the plating stubs of the conductive lines 10 and 11 to the conductive line 26 is also large.

In actuality, the digital signal has high-frequency components from several times to ten times the nominal frequency, including harmonic components. When noise occurs, because these high-frequency components are sensitive to noise, the resulting effect on the signal is considerable. But, according to the Embodiment 3 of the present invention, as a consequence of the above configuration, even if electromagnetic radiation and noise from the plating stubs of the conductive lines 10 and 11 occur, adverse effects on the conductive line 26 transmitting digital signals can be prevented.

Hence a semiconductor device can be supplied in which noise is minimal and there is little distortion of digital signal transmission waveforms.

The above embodiments 1, 2 and 3 have been explained separately for different signal types, but the essence of these embodiments 1, 2 and 3 need only be realized for a plating stub of at least one conductive line and plating stubs adjacent thereto. This invention also includes semiconductor devices in which the above embodiments 1, 2 and 3 are simultaneously realized in the various conductive lines of a single semiconductor device.

(Embodiment 4)

Figure 7A:
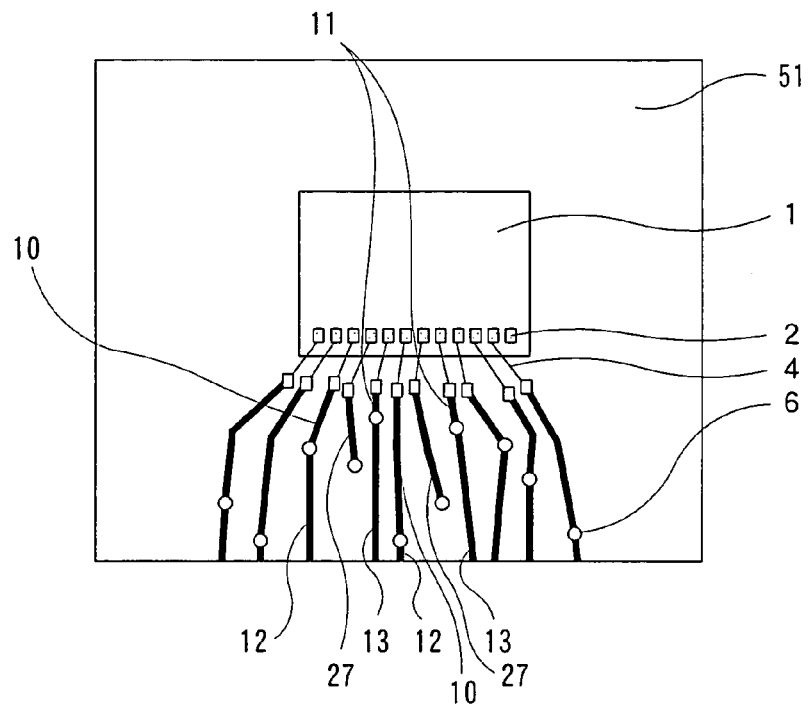
FIG. 7A and FIG. 7B show an example of wiring pattern of embodiment 4 of the semiconductor device of this invention.
Figure 7B:
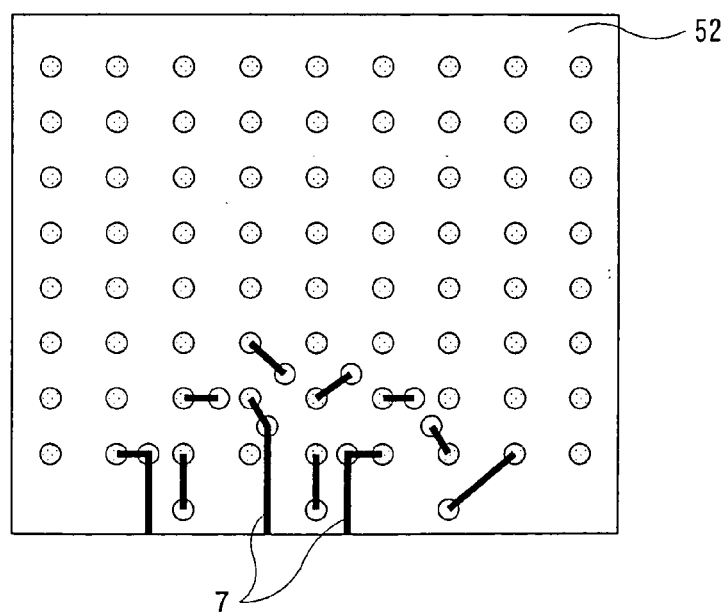

FIG. 7A and FIG. 7B show an example of wiring patterns of embodiment 4 of a semiconductor device of this invention. This embodiment 4 differs from embodiment 3 in that the frequency band for transmission is 100 MHz or higher. The effect of noise is especially great for digital signals at frequencies of 100 MHz and above. Therefore a configuration is adopted in which the plating stub 7 connected to a conductive line 27 which transmits those digital signals at 100 MHz and above, and the plating stubs 12, 13 connected to the conductive lines 10 and 11 on either side, are selected, and are provided on different conductive wiring layers 51 and 52.

According to the above configuration, the plating stub 7 of the conductive line 27 which transmits those digital signals at 100 MHz and above is on a wiring layer different from that of the plating stubs 12 and 13 of the neighboring conductive lines 10 and 11, so that these plating stubs are not adjacent, the interval between these plating stubs is large, and the distance between the conductive line 27 and the plating stubs 12 and 13 of the conductive lines 10 and 11 on either side thereof is also large.

When signal frequencies reach 100 MHz and higher, considering cases in which signals at approximately 1 GHz are transmitted as harmonic components, measures to deal with noise must be given priority. In such cases, because conductive line intervals are secured only for the signals at 100 MHz and higher among all digital signals, more effective countermeasures are possible than in the embodiment 3.

That is, in the wiring pattern example of FIG. 7, compared with the wiring pattern example of FIG. 6, only the plating lead 7 of the conductive line 27 carrying signals at 100 MHz and higher is provided in a different wiring layer. Consequently even if electromagnetic radiation and noise occur from the other plating stubs 12 and 13, adverse effects on the conductive line 27 transmitting digital signals at 100 MHz and higher can be prevented.

Hence a wiring board for semiconductor devices can be supplied in which noise is minimal and there is little distortion of the waveforms of transmitted digital signals.

(Embodiment 5)

Figure 8A:
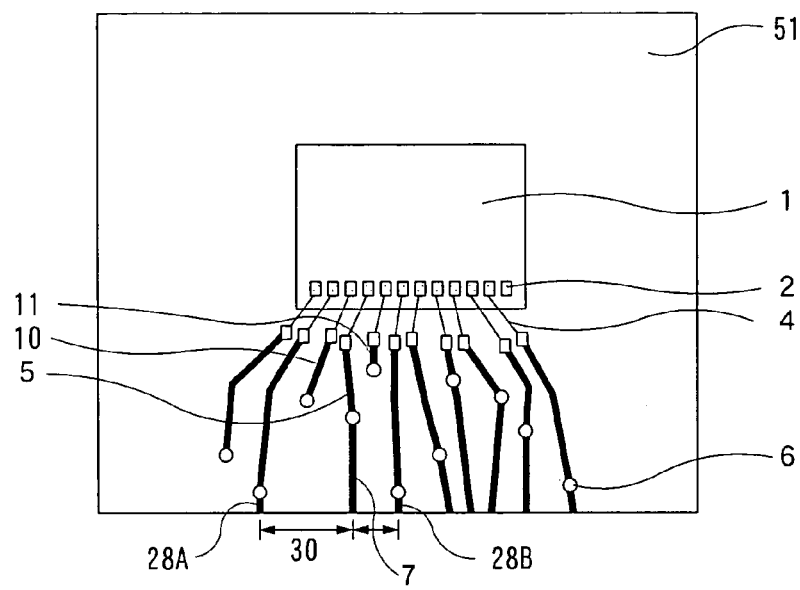
FIG. 8A to FIG. 8C show an example of a wiring pattern of embodiment 5 of the semiconductor device of this invention.
Figure 8B:
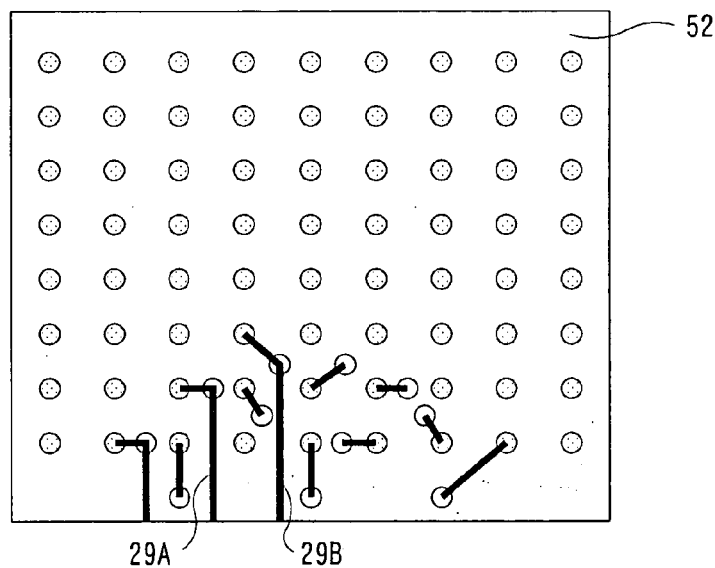
Figure 8C:
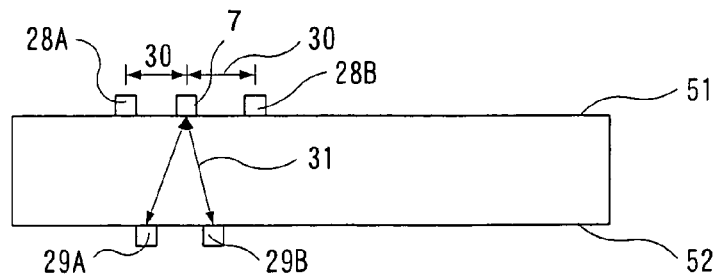

FIG. 8A to FIG. 8C show an example of a wiring pattern of embodiment 5 of a semiconductor device of this invention. In this embodiment 5, the differences with embodiments 1 through 4 are as follows. That is, a configuration is employed in which the distance between the plating stub 7 of the conductive line 5 and the plating stubs 29A and 29B attached to the conductive lines 10 and 11 on either side of the conductive line 5 and existing in a different wiring layer is greater than the minimum interval from the plating stub 7 of the conductive line 5 to the plating stubs 28A and 28B attached to other conductive lines in the same wiring layer within which the conductive line 5 is formed.

That is, a configuration is adopted in which the interval 31 between the plating stub 7 and the plating stubs 29A, 29B in a different wiring layer 52 is greater than the minimum interval 30 from the plating stub 7 in the same wiring layer 51 as the conductive line 5 to the plating stubs 28A, 28B. Here the conductive line 5 is addressed, but the type of signal carried by this line may be analog, digital, a power supply, or ground.

According to the above configuration, the plating stub 7 of a certain conductive line 5 is in a wiring layer different from that of the plating stubs 29A, 29B of the conductive lines 10, 11 on either side thereof, and in addition the distance thereto is larger than the distance within the same wiring layer to the closest wiring stubs 28A, 28B, so that the plating stubs 29A, 29B of the conductive lines 10, 11 on either side are at positions sufficiently distant from the plating stub 7 of the conductive line 5. Consequently even if electromagnetic radiation and noise occur in the plating stubs 29A, 29B, adverse effects on the conductive line 5 can be prevented.

Hence a wiring board for a semiconductor device can be supplied in which noise is minimal and there is little distortion of transmission waveforms.

(Embodiment 6)

Figure 9:
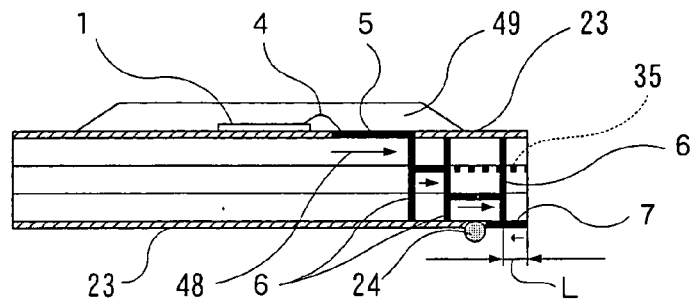
FIG. 9 shows an example of a wiring pattern of embodiment 6 of the semiconductor device of this invention.

This embodiment 6 also differs from the above-described embodiments 1 through 4 only in the wiring pattern, and so only the wiring pattern is described. FIG. 9 is a cross-sectional view of embodiment 6 of a semiconductor device of this invention; 1 denotes a semiconductor element, 5 denotes a conductive line, 4 denotes a wire, and 6 denotes a via-hole.

The arrows 48 indicate a series of signal paths; the signal paths 48 are from the semiconductor element 1 to the wire 4, then to the conductive line 5, and through several via-holes 6 to arrive at the solder ball 24. The semiconductor element 1 is sealed with resin 49. 23 denotes a solder resist. In this embodiment 6, the circuit is formed using a four-layer board.

In this embodiment 6, the fourth layer is selected as the wiring layer for the plating stub 7, in order that the length L of the plating stub 7 becomes as short as possible. That is, when a tentatively imagined plating stub 35, indicated by a dotted line, is provided in the second layer, the length thereof is the distance from the outer periphery of the wiring board to the via-hole 6, but when provided in the fourth layer, the length L of the plating stub 7 is the distance from the wiring board outer periphery to the via-hole 6, and so is clearly shorter.

Figure 10:
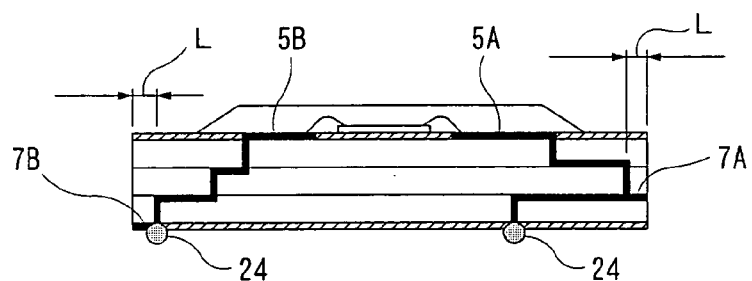
FIG. 10 shows an example of another wiring pattern of the wiring board of embodiment 6 of the semiconductor device of this invention.

In this embodiment 6, such a selection method is adopted for each of the plating stubs attached to all of the conductive lines. FIG. 10 is a cross-sectional view of a semiconductor device in this embodiment 6, showing an example in which the shortest plating stubs are provided for each conductive line. For the conductive line 5A, the plating stub 7A is provided in the second layer; for the conductive line 5B, the plating stub 7B is provided in the third layer. If the number of layers and the number of lines are increased, the number of selections increases, but the method is similar to that described above.

According to the above configuration, the plating stubs 7, 7A and 7B are each attached to the respective conductive line 5 with the shortest length, and electromagnetic radiation, noise, and other electromagnetic effects from the plating stubs 7, 7A, 7B are minimized. When controlling impedance also, the electrical effects of the plating stubs 7, 7A, 7B can be ignored, so that the control is easily achieved.

Hence a semiconductor device can be supplied with little noise and electromagnetic radiation, and with little energy loss.

(Embodiment 7)

Figure 11:
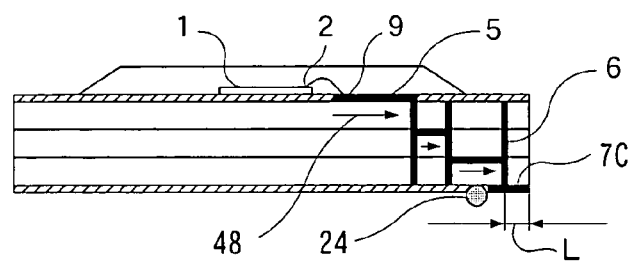
FIG. 11 shows an example of a wiring pattern of embodiment 7 of the semiconductor device of this invention.

FIG. 11 is a cross-sectional view of embodiment 7 of a semiconductor device of this invention.

In this embodiment 7, the conductive line 5 is positioned in one direction along the arrow 48 of the signal path, through the wiring board toward the outside thereof. 6 denotes a via-hole. That is, from the pad 9 connected to the terminal of the electrode 2 on the semiconductor element 1, until the solder ball 24 on the opposite side, layout follows the shortest distance. Further, here the plating stub 7C is connected by the shortest distance to the lowermost-layer conductive wiring edge. Hence compared with cases of, for example, connection to the wiring edge of another wiring layer, the plating stub 7C is the shortest. L is the length thereof. This is, at least, achieved in one conductive line 5.

According to the above configuration, the plating stub 7C is attached to the various conductive lines by the shortest length, and the effect of the plating stub on the conductive lines is minimized; as a result, the effects on the plating stubs of neighbors is also reduced. In particular, a plating stub may have capacitance or inductance properties if the length of the line is long compared with the frequency transmitted, that is, compared with the wavelength, and may affect the attached conductive line; hence as signal speeds increase and wavelengths grow shorter, the relative effect of the plating stub length increases, and there are concerns that this effect may be augmented. In other words, the transmission waveform which should ordinarily be present is distorted. This embodiment 7 acts to prevent such adverse effects. Further, when controlling impedance also, electrical effects of plating stubs can be ignored, so that the control is easily achieved.

Hence a semiconductor device can be supplied in which, when transmitting signals, the distortion of the transmission waveform is minimal.

(Embodiment 8)

Figure 12:
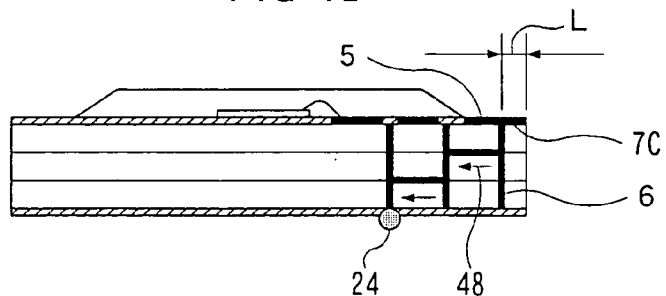
FIG. 12 shows an example of a wiring pattern of embodiment 8 of the semiconductor device of this invention.

FIG. 12 is a cross-sectional view of embodiment 8 of a semiconductor device of this invention. The reference numerals in the figure are all the same as those used in FIG. 11. In this embodiment 8, the conductive line 5 is positioned in one direction, indicated by the arrow 48, through the via-hole 6 toward the center of the wiring board. That is, wiring is along the shortest distance from the via-hole 6 to the solder ball 24. Here, the plating stub 7C is connected over the shortest distance to the conductive line on the uppermost layer. Consequently here also, the plating stub is shortest compared for example with cases of connection to the wire ends of other wiring layers. This is realized for at least one conductive line.

The action of this embodiment 8, similarly to the previous embodiment 7, consists in reduction of effects of the plating stub 7C on the conductive line 5 itself attached thereto, as well as of effects on adjacent plating stubs. When controlling impedance also, the electrical effects of the plating stub 7C can be ignored, so that the control is easily achieved.

Hence a semiconductor device can be supplied in which, when transmitting signals, the distortion of the transmission waveform is minimal.

(Embodiment 9)

Figure 13:
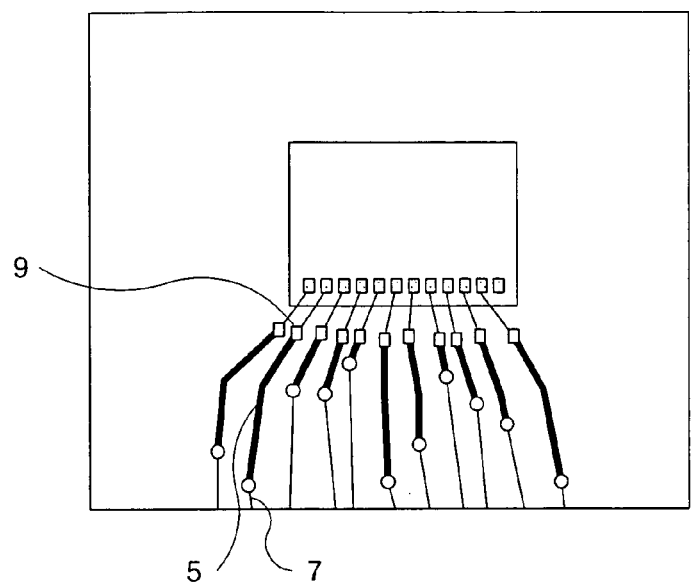
FIG. 13 shows an example of a wiring pattern of embodiment 9 of the semiconductor device of this invention.

FIG. 13 shows a wiring pattern of embodiment 9 of a semiconductor device of this invention.

In this embodiment 9, the width of the plating stub 7 is smaller than the width of the conductive line attached thereto. 9 denotes a pad provided on the connected end of the conductive line 5. As stated above, if the interval between the lines is simply broadened without changing the width, there may be cases in which the line interval is narrower on the side opposite of the broadened side; but when as in this case the line width of the plating stub 7 is smaller there is no such concern, and the only change is the decreased width of the relevant line, so that there is the advantageous result that the line interval can be broadened on both sides. In addition, the line widths can be made small, and the resistance value of the plating stub 7 can be raised. Because the stub itself is not in the signal path, the resistance value thereof is not directly related to signals transmitted by conductive lines.

According to this configuration, line intervals between adjacent plating stubs 7 are broadened, and distances between adjacent plating stubs 7 and conductive lines 5 are also increased. Also, because the line widths of plating stubs 7 are small, the resistance of this portion is large, and so even if noise voltages flow in from outside, the absolute value of currents reaching attached conductive lines is small. Hence noise from adjacent conductive lines passing through a plating stub 7, and also radiation and noise flowing into conductive lines from this plating stub 7 via adjacent plating stubs, can be reduced.

Consequently a semiconductor device can be supplied in which there is little distortion of transmitted waveforms when signals are transmitted.

(Embodiment 10)

Figure 14:
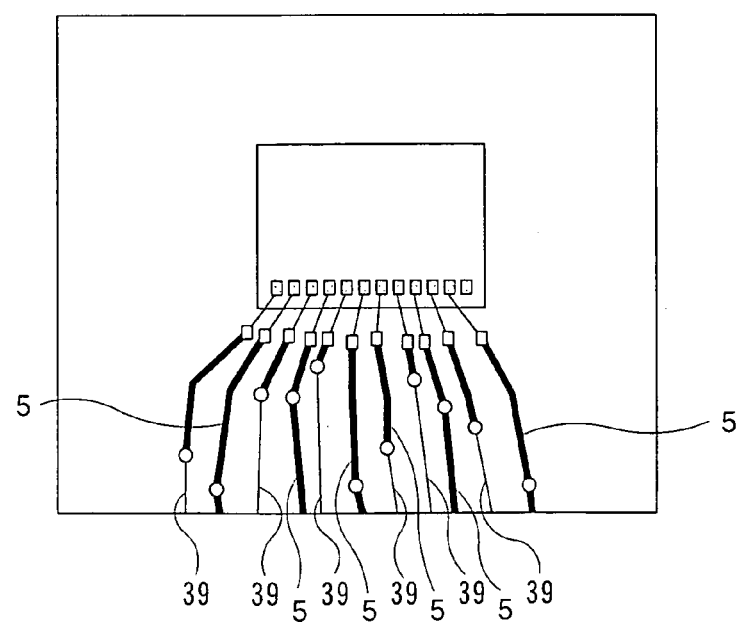
FIG. 14 shows an example of a wiring pattern of embodiment 10 of the semiconductor device of this invention.

FIG. 14 shows the wiring pattern in embodiment 10 of a semiconductor device of this invention. This embodiment 10 differs from embodiment 9 in that the line width of only those plating stubs 39 arranged alongside conductive lines 5 are smaller than the line widths of conductive lines to which the plating stubs 39 are attached. When a plating stub 39 is provided substantially alongside an adjacent conductive line 5, noise from the conductive line 5 enters the plating stub 39, and there is a large possibility of adverse effects of disturbances on the signal waveform in the conductive line attached to this plating stub 39; but when the plating stub 39 has a line width smaller than that of the conductive line 5 alongside the plating stub 39, the adverse effects are effectively diminished. When the number of terminals of the semiconductor element is increased, so that wiring densities are increased, the above problem becomes more conspicuous, possibly leading to signal malfunctions; such situations can be prevented by this means.

According to this configuration, noise from the conductive lines 5, 5 on either side via the plating stub 39, and radiation and noise from this plating stub 39 affecting the adjacent conductive lines 5, 5, can be reduced.

Hence a semiconductor device can be supplied in which there is little distortion of transmitted waveforms when signals are transmitted.

(Embodiment 11)

Figure 15:
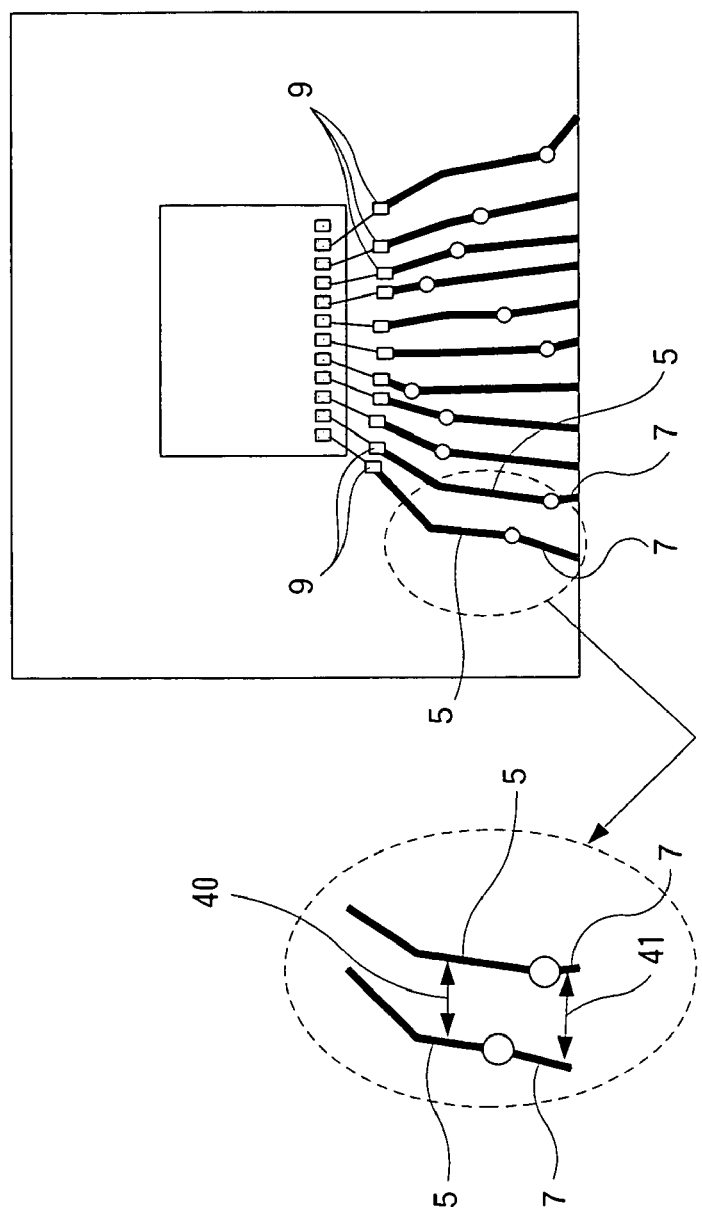
FIG. 15 shows an example of a wiring pattern of embodiment 11 of the semiconductor device of this invention.

FIG. 15 shows the wiring pattern in embodiment 11 of a semiconductor device of this invention. In this embodiment 11, the line interval 41 between adjacent plating stubs 7, 7 is larger than the line interval 40 between the conductive lines 5, 5 to which these stubs 7, 7 are attached. In a normal wiring, the pitch of the pads 9 is the smallest for the conductive lines, and the space between lines increases toward the board periphery, so that the interval 41 between plating stubs 7, 7 can be formed larger than the interval 40 between the conductive lines 5, 5. Consequently the possibility of receiving noise from plating stubs 7 is reduced. There is the possibility that, for example, noise from adjacent conductive lines or adjacent plating stubs may enter a plating stub 7, to have an adverse effect in disturbing the signal waveform in the conductive line 5 attached thereto; but if the plating stub interval is large, this possibility is reduced. Also, when the number of terminals of the semiconductor element is increased, lines increase in density, so that disturbance of signal waveforms becomes more prominent, leading to signal malfunctions; such situations can be prevented by this means.

According to this configuration, noise from adjacent conductive lines 5, 5 via a plating stub 7, as well as radiation and noise from this plating stub 7 entering conductive lines 5 via adjacent plating stubs 7, can be reduced.

Hence a semiconductor device can be supplied in which there is little distortion of transmitted waveforms when signals are transmitted.

(Embodiment 12)

Figure 16:
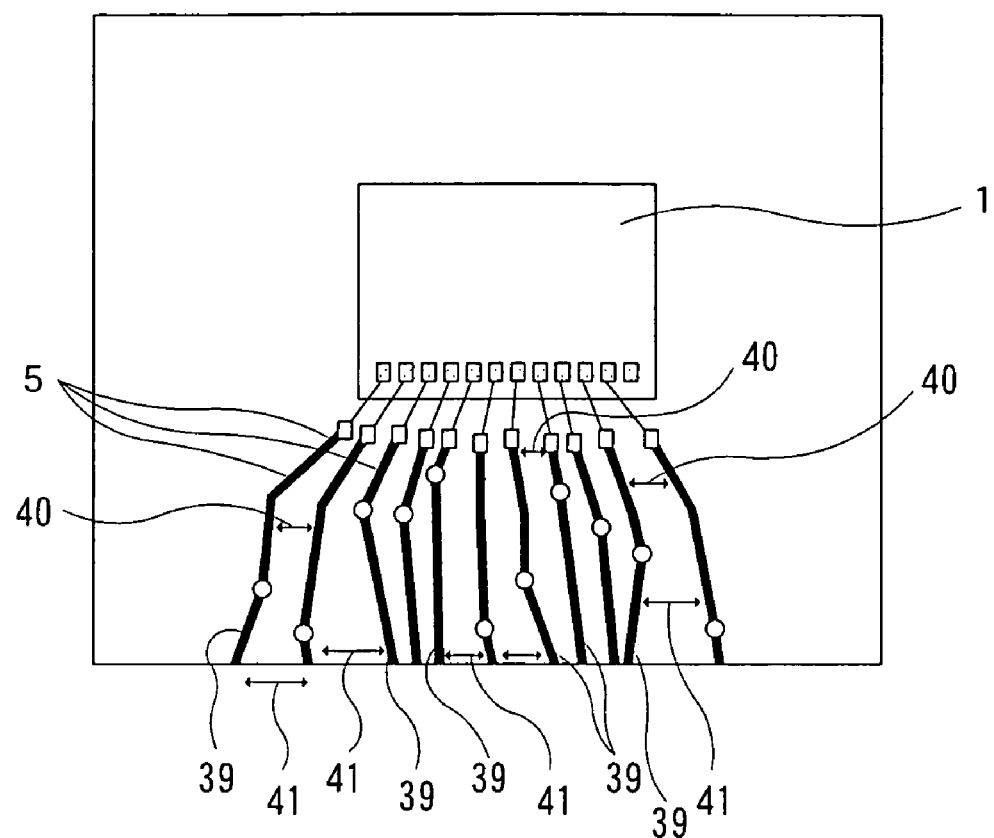
FIG. 16 shows an example of a wiring pattern of embodiment 12 of the semiconductor device of this invention.
Figure 17:
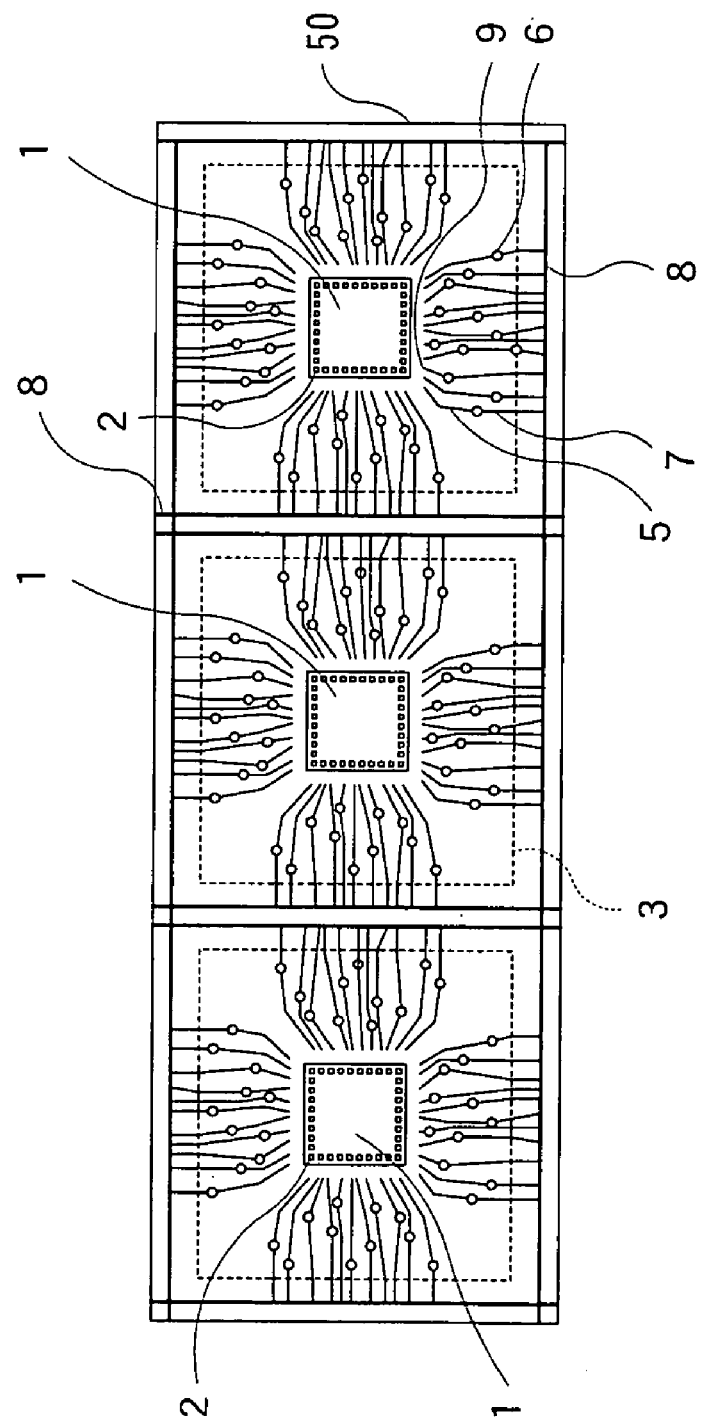
FIG. 17 is a plan view of a wiring board of a well-known semiconductor device; and, FIG. 18A and FIG. 18B show an example of wiring pattern in a well-known semiconductor device.
Figure 18A:
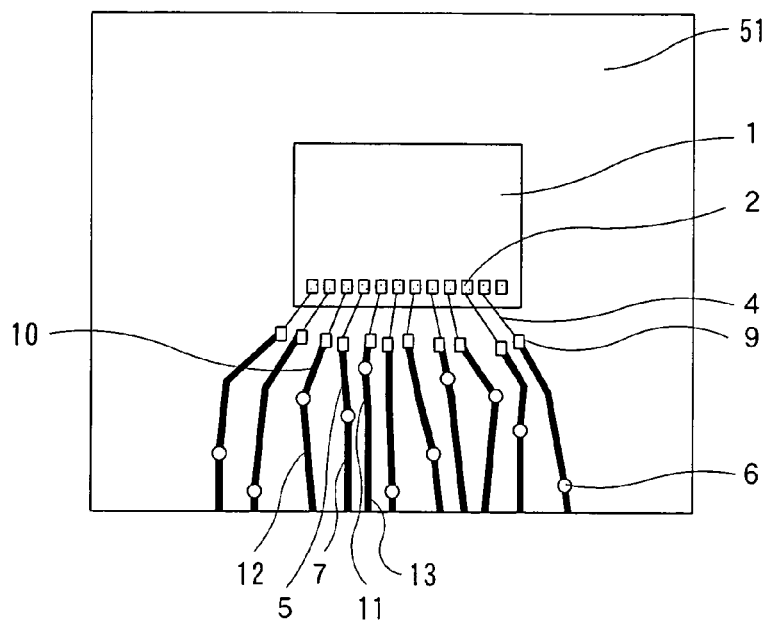
Figure 18B:
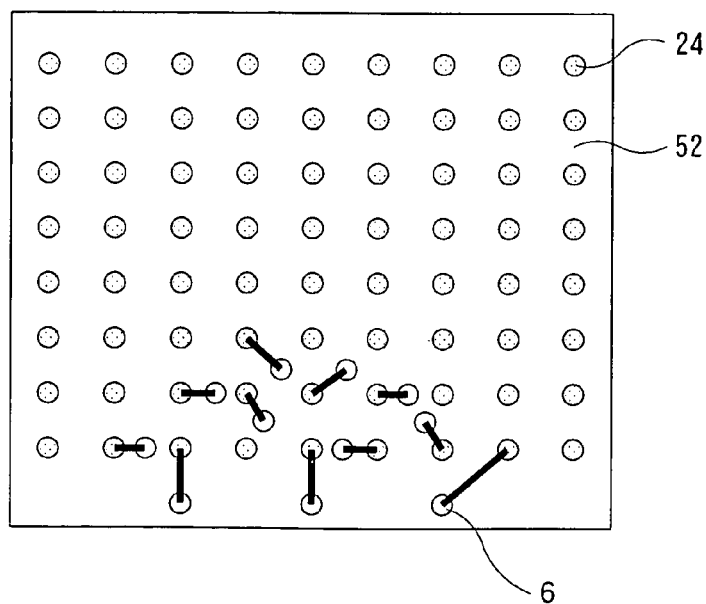

FIG. 16 shows the wiring pattern in embodiment 12 of a semiconductor device of this invention. This embodiment 12 differs from embodiment 11 in that the line interval between plating stubs and conductive lines 5 is, for a plating stub 39 alongside adjacent conductive lines 5 only, larger than the line interval between the conductive line 5 attached to this plating stub 39 and other conductive lines 5.

When a plating stub 39 is arranged substantially alongside an adjacent conductive line 5, noise from the conductive line 5 enters the plating stub 39, and there is a greater possibility of adverse effects of disturbances on the signal waveform in the conductive line 5 attached to this plating stub 39. However, if the line interval 41 between plating stubs 39 is larger than the interval 40 between the conductive lines 5 attached thereto, the adverse effect is effectively reduced. Because the line density increases as the number of terminals of the semiconductor element 1 is increased, the above problem becomes more prominent, leading to signal malfunctions; such situations can be prevented by this means.

According to this configuration, noise from adjacent conductive lines 5, 5 passing through the plating stubs 39, and radiation and noise entering conductive lines 5 from the plating stubs 39, can be reduced.

Hence a semiconductor device can be supplied in which there is little distortion of transmitted waveforms when signals are transmitted.

What is claimed is:

1. A semiconductor device, comprising:
a base,
a semiconductor element having a plurality of electrodes,
a plurality of conductive lines connected to the electrodes of said semiconductor element, plating stubs attached to said conductive lines, and wiring layers formed in a plurality of layers on said base; and
wherein the plating stub attached to a first conductive line, and the plating stubs attached to one or a plurality of second conductive lines adjacent to said first conductive line, exist in different conductive wiring layers.

2. The semiconductor device according to claim 1, wherein the first conductive line is connected to ground or a power supply.

3. The semiconductor device according to claim 1, wherein a distance between the plating stub attached to the first conductive line and the plating stubs attached to the second conductive lines is larger than a minimum line interval between the plating stub attached to the first conductive line and plating stubs existing in the same wiring layer as the plating stub attached to the first conductive line.

4. The semiconductor device according to claim 1, wherein the signals transmitted by the first conductive line are digital signals.

5. The semiconductor device according to claim 4, wherein the digital signals have a frequency band of 100 MHz or higher.

6. The semiconductor device according to claim 1, wherein, compared with the maximum line intervals between adjacent conductive lines, the plating stubs attached to the conductive lines are formed with larger line intervals.

7. The semiconductor device according to claim 6, comprising a first conductive line, a second conductive line, and a plating stub attached to the first conductive line, wherein the first conductive line and the plating stub are arranged to be adjacent to the second conductive line, and the line maximum interval between said plating stub and said second conductive line is formed larger than the line interval between the first conductive line and second conductive line.

8. A semiconductor device, comprising:
a base having two faces, a central portion and a peripheral portion,
a semiconductor element provided on one face of the base and having a plurality of electrodes, a plurality of conductive lines connected to the electrodes of said semiconductor element, said conductive lines are formed from said electrodes toward the face opposite of the face of the base on which the semiconductor element is provided, spanning a plurality of wiring layers, and from said peripheral portion of the base toward said central portion, and said plating stubs are formed in the wiring layers of the face on the side of said semiconductor element, from the conductive lines to said peripheral portion of the base.

9. A semiconductor device, comprising a plurality of conductive wiring layers, a semiconductor element having a plurality of electrodes, first and second conductive lines connected to the electrodes of the semiconductor element, and a plating stub attached to said first conductive line, wherein said first conductive line and the plating stub are arranged adjacent to the second conductive line, and the line width of said plating stub is formed smaller than the line widths of said first and/or second conductive lines, wherein the plating stub attached to the first conductive line and a plating stub attached the second conductive line are in different conductive wiring layers.

* * * * *